United States Patent
Gregoire

(10) Patent No.: US 11,222,957 B2
(45) Date of Patent: Jan. 11, 2022

(54) INTERMETALLIC COMPOUND

(71) Applicant: STMicroelectronics (Crolles 2) SAS, Crolles (FR)

(72) Inventor: Magali Gregoire, Crolles (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/907,986

(22) Filed: Jun. 22, 2020

(65) Prior Publication Data
US 2020/0411657 A1 Dec. 31, 2020

(30) Foreign Application Priority Data

Jun. 28, 2019 (FR) .................................. 1907194

(51) Int. Cl.
| | |
|---|---|
| *H01L 29/45* | (2006.01) |
| *H01L 21/321* | (2006.01) |
| *H01L 21/285* | (2006.01) |
| *H01L 21/3213* | (2006.01) |
| *H01L 29/06* | (2006.01) |
| *H01L 29/08* | (2006.01) |
| *H01L 29/161* | (2006.01) |

(52) U.S. Cl.
CPC ........ *H01L 29/45* (2013.01); *H01L 21/28568* (2013.01); *H01L 21/321* (2013.01); *H01L 21/32133* (2013.01); *H01L 29/0649* (2013.01); *H01L 29/0847* (2013.01); *H01L 29/161* (2013.01)

(58) Field of Classification Search
CPC ... H01L 29/16; H01L 29/164; H01L 29/1649; H01L 29/08; H01L 29/084; H01L 29/0847; H01L 29/161; H01L 29/45; H01L 21/28; H01L 21/285; H01L 21/2856; H01L 21/28568; H01L 21/32; H01L 21/321; H01L 21/3213; H01L 21/32133
USPC ......................................................... 257/347
See application file for complete search history.

(56) References Cited

U.S. PATENT DOCUMENTS

| | | | |
|---|---|---|---|
| 5,371,378 A | * | 12/1994 | Das .................... H01L 29/1602 257/197 |
| 9,637,925 B2 | * | 5/2017 | Francies, III ........... E04C 5/168 |
| 2008/0274611 A1 | | 11/2008 | Cabral et al. |

(Continued)

OTHER PUBLICATIONS

Detavernier C et al.: "Influence of Pt addition on the texture of NiSi on Si (001)", Applied Physiscs Letters, A I P Publishing LLC, US, vol. 84, No. 18, May 3, 2004 (May 3, 2004), pp. 3549-3551, XP012061305, ISSN: 0003-6951, DOI: 10.1063/1.1719276 * p. 3549-p. 3551; figures 2, 3 *.

(Continued)

*Primary Examiner* — Monica D Harrison
(74) *Attorney, Agent, or Firm* — Crowe & Dunlevy

(57) ABSTRACT

A NiPt layer with a Pt atom concentration equal to 15% plus or minus 1% is deposited on a semiconductor region (which may, for example, be a source/drain region of a MOS transistor). An anneal is then performed at a temperature of 260° C. plus or minus 20° C., for a duration in the range from 20 to 60 seconds, in order to produce, from the Nickle-Platinum (NiPt) layer and the semiconductor material of said semiconductor region, an intermetallic layer. Advantageously, the intermetallic layer possesses a structure of heteroepitaxy with the semiconductor material, and includes free Pt atoms.

14 Claims, 2 Drawing Sheets

(56) References Cited

U.S. PATENT DOCUMENTS

2009/0127594 A1* 5/2009 Arunachalam ... H01L 21/28518
257/288
2014/0363972 A1 12/2014 Sargunas

OTHER PUBLICATIONS

Huang H-J et al: "Reduction of Source /Drain Series Resistance and Its Impact on Device Performance for PMOS Transistors With Raised SI1-XGEX Source/Drain", IEEE Electron Device Letters, IEEE Service Center, New York, NY, US, vol. 21, No. 9, Sep. 15, 2000 (Sep. 15, 2000), pp. 400-402, XP000954361, ISSN: 0741-3106, DOI: 10.1109/55.887465 * p. 400 *.

INPI Search Report and Written Opinion for FR Appl. No. 1907194 dated Nov. 11, 2019 (10 pages).

Qing-Tai Zhao et al.: "Ultrathin epitaxial Ni-silicide contacts on (100) Si and SiGe: Structural and electrical investigations", Microelectronic Engineering, vol. 107, Nov. 20, 2012 (Nov. 20, 2012), pp. 190-195, XP002795542, DOI: 10.1016/j.mee.2012.10.014 * pp. 193, 195; figures 11, 12b *.

Takeshi Sonehara et al.: "Contact resistance reduction of Pt-incorporated Nisi for continuous CMOS scaling ~ Atomic level analysis of Pt/B/As distribution within silicide films ~", IEEE International Electron Devices Meeting, 2008 : IEDM 2008 ; San Francisco, CA, USA, Dec. 15-17, 2008, IEEE, Piscataway, NJ, USA, Dec. 15, 2008 (Dec. 15, 2008), pp. 1-4, XP031434606, ISBN: 978-1-4244-2377-4 * p. 2; figures 8, 22 *.

Zhang, Zhen, et al.: "Exploitation of a Self-Limiting Process for Reproducible Formation of Ultrathin Ni(1-x)Ptx Silicide Films," Applied Physics Letters 97, 252108 (2010) (3 pages).

Panciera, Federico, et al.: "Direct Epitaxial Growth of 0-Ni2Si by Reaction of Thin Ni(10at.%Pt) Film with Si(100) Substrate," Scripta Materialia, May 2014 (9 pages).

\* cited by examiner

INTERMETALLIC COMPOUND

PRIORITY CLAIM

This application claims the priority benefit of French Application for Patent No. 1907194 filed on Jun. 28, 2019 the content of which is hereby incorporated by reference in its entirety to the maximum extent allowable by law.

TECHNICAL FIELD

The present disclosure generally concerns integrated circuits, and more particularly integrated circuits comprising intermetallic compounds obtained from a semiconductor and nickel (Ni).

BACKGROUND

Integrated circuits where components are formed from a semiconductor layer are known. To make an electrical contact to a semiconductor region of such a component, it is provided to form, on this region, at least at the location of the electrical contact, an intermetallic compound. The intermetallic compound is formed during an anneal step, from the semiconductor material of the semiconductor region and a metal deposited on the semiconductor region. The intermetallic compound is then an alloy of this metal and of the semiconductor material of the semiconductor region.

In the specific case where the metal is nickel, known manufacturing methods result in an intermetallic compound suffering from various disadvantages.

There is a need for a method providing an intermetallic compound based on nickel overcoming all or part of the disadvantages of nickel-based intermetallic compounds obtained by existing methods.

There is a need for an integrated circuit comprising a nickel-based intermetallic compound overcoming all or part of the disadvantages of electronic circuits comprising a known nickel-based intermetallic compound.

SUMMARY

An embodiment overcomes all or part of the disadvantages of known methods of obtaining a nickel-based intermetallic compound.

An embodiment overcomes all or part of the disadvantages of integrated circuits comprising a known nickel-based intermetallic compound.

An embodiment provides a method comprising: a) depositing, on a semiconductor region, a NiPt layer with a Pt atom concentration equal to 15% plus or minus 1%; and b) annealing at a temperature of 260° C. plus or minus 20° C., for a time period in the range from 20 to 60 seconds.

According to an embodiment, the method further comprises, after step b), a step c) comprising removing by etching the NiPt layer.

According to an embodiment, the method further comprises, after step c), a step d) comprising performing another anneal.

According to an embodiment, step d) is carried out at a temperature greater than 380° C.

According to an embodiment, the semiconductor region has an epitaxial crystal structure.

According to an embodiment, the semiconductor region is made of Si, of Ge, or of SiGe, preferably of SiGe.

According to an embodiment, the method further comprises, before step a), a step of forming the semiconductor region by epitaxy.

According to an embodiment, the epitaxy is carried out from a semiconductor layer made of Si, of Ge, or of SiGe, preferably of Si.

According to an embodiment, the semiconductor layer is a solid substrate or rests on an insulating layer itself resting on a support substrate.

An embodiment provides an integrated circuit comprising a semiconductor region and a layer of an intermetallic compound of $NiSi_xGe_{(1-x)}$, of NiGe, or of NiSi resting on and in contact with the semiconductor region, wherein the Ni is in a stoichiometric proportion with respect to the semiconductor atoms of the intermetallic compound, and wherein the intermetallic compound has a crystal structure aligned with the crystal structure of the semiconductor region.

According to an embodiment, the crystal orientation of the intermetallic compound is fixed.

According to an embodiment, the layer of the intermetallic compound comprises free Pt atoms.

According to an embodiment, the concentration of Pt atoms in the layer of the intermetallic compound is maximum at the upper surface of the layer of the intermetallic compound and is preferably in the range from 15 to 25% of Pt atoms.

According to an embodiment, the circuit is obtained by the implementation of the described method.

According to an embodiment, the semiconductor region is a source or drain region of a MOS transistor.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
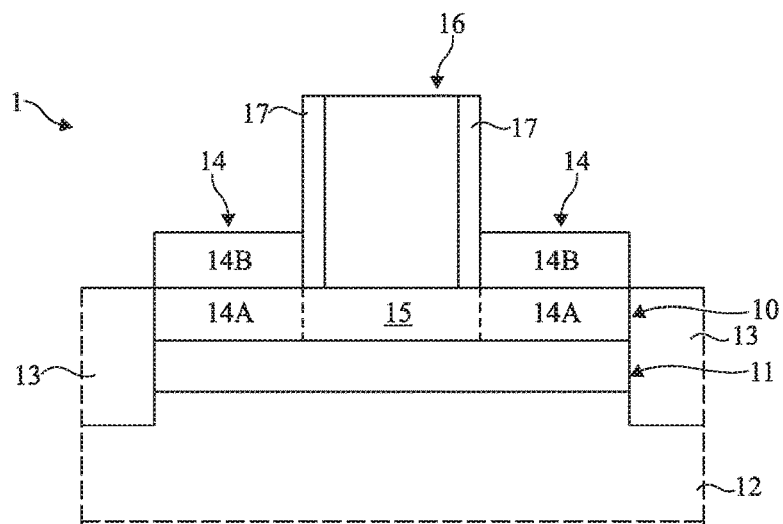
FIG. 1 schematically shows in cross-section view an example of an electronic component of an integrated circuit to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the integrated circuits and the components of such circuits where a nickel-based intermetallic compound may be provided have not been detailed, the described embodiments being compatible with usual integrated circuits and the usual electronic components of such circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 schematically shows in cross-section view an example of an electronic component (comprising here a MOS transistor 1) of an integrated circuit to which the described embodiments apply.

Transistor 1 is formed inside and/or on top of a semiconductor layer 10, for example, made of silicon-germanium (SiGe), of silicon (Si), or of germanium (Ge), preferably of silicon. In this example, semiconductor layer 10 rests on an insulating layer 11, itself resting on a support substrate 12, for example, made of silicon, layers 10 and 11 forming an SOI-type structure ("Silicon On Insulator"). As a variation, semiconductor layer 10 is a solid semiconductor substrate.

Transistor 1 belongs to an integrated circuit that, for example, comprises other components (not shown) formed inside and/or on top of layer 10. In this example, transistor 1 is electrically insulated from other components (not shown) of the circuit by trenches 13 filled with an insulator, for example, silicon oxide ($SiO_2$). In this example where layer 10 is of SOI type, trenches 13 cross layer 10 and, for example, layer 11.

Transistor 1 comprises two doped (source and drain) semiconductor regions 14. Regions 14 are separated from each other by a channel-forming region 15 extending in layer 10, in the present example across the entire thickness of layer 10. Dotted lines very schematically delimit region 15 in the drawings. A gate or gate stack 16 rests on and in contact with region 15. Gate 16 comprises a conductive gate electrode, for example, made of polysilicon, and a gate insulator, for example, made of silicon oxide, interposed between the gate electrode and region 15 to insulate them from each other, and the gate electrode and the gate insulator are not detailed in the drawings. Conventionally, in the present example, spacers 17 made of an insulating material cover the sides of gate 16.

Each region 14 comprises a portion 14A of layer 10. In this example, each region 14 further comprises a semiconductor region 14B resting on and in contact with layer 10, and more particularly on and in contact with a corresponding portion 14A of layer 10. Regions 14B are formed during a step of epitaxy from layer 10. Regions 14B are, for example, made of Si, of Ge, or of SiGe. Preferably, regions 14B are made of SiGe, the Ge atom concentration in the SiGe being, for example, in the range from approximately 20% to approximately 50%, for example, in the range from 30 to 35%, preferably in the order of 33%, and more preferably equal to 33%.

Each region 14 may be N-type or P-type doped, for example, by implantation of dopant atoms or in situ during the epitaxy of regions 14B.

To electrically connect to the transistor 1, although this is not shown herein, it is provided to form conductive vias all the way to gate 16 and to regions 14, and more particularly, herein, to semiconductor regions 14B.

Prior to the forming of the vias, it is provided to form a layer of an intermetallic compound in contact with regions 14, more particularly, herein, on regions 14B, by depositing a layer comprising nickel on regions 14, more particularly, herein, on regions 14B, and by performing an anneal. During the anneal, the intermetallic compound forms from the semiconductor material of regions 14, more particularly, herein, of regions 14B, and from the deposited nickel. In the case where the semiconductor material is silicon, germanium or silicon-germanium, the obtained intermetallic compound is respectively silicide, germanide, or germanosilicide. In the present example, during these steps, the layer comprising nickel is also deposited on gate 16 and, possibly, an intermetallic compound then forms at the top of gate 16.

A disadvantage of known nickel-based intermetallic compounds is that the alloy between the semiconductor and the metal may agglomerate, particularly during subsequent anneal steps. Such agglomerates or clusters generally comprise NiSi or NiSiGe. The clusters in the intermetallic compound result in a deterioration of the electric and/or physical properties of the intermetallic compound.

Another disadvantage of known nickel-based intermetallic compounds is that such compounds may diffuse into the semiconductor regions that they cover. In particular, in the case of transistor 1, the known nickel-based intermetallic compounds which would have formed on regions 14B may diffuse into region 15, resulting in a deterioration of the electric properties of the transistor. This is more particularly true when the transistor is formed from a thin semiconductor layer of a SOI or FDSOI ("Fully Depleted Semiconductor on Insulator") structure having a thickness smaller than 20 nm, for example, smaller than 15 nm, for example, equal to 11 nm, and when the known intermetallic compound is formed on a semiconductor region epitaxially grown from the SOI semiconductor region, the thickness of the epitaxial region being for example in the range from approximately 10 nm to approximately 20 nm, preferably in the range from 10 to 20 nm, for example, in the range from 14 to 16 nm approximately, preferably in the range from 14 to 16 nm.

Figure 2:
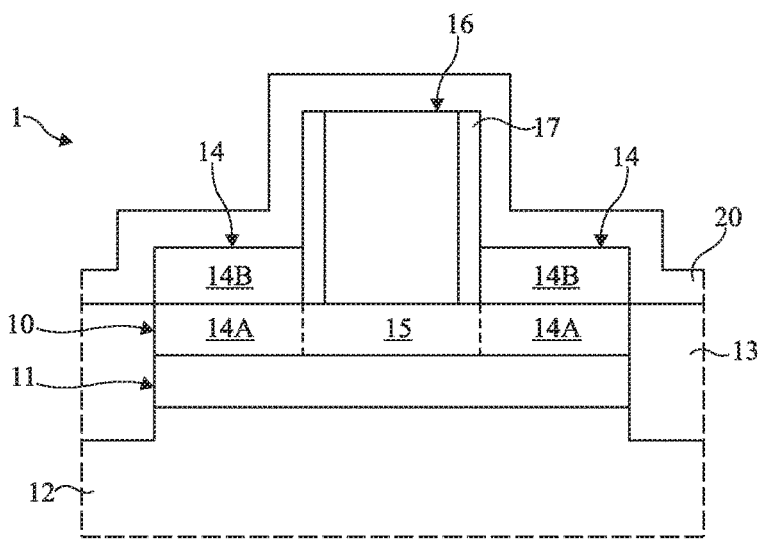
FIG. 2 schematically shows in cross-section view the component of FIG. 1 at a step of an implementation mode of a method of manufacturing a nickel-base intermetallic compound.

An implementation mode of a method will now be described in relation with FIGS. 2 to 4. In the present example, the method is implemented from transistor 1 of FIG. 1. However, this method may be implemented to form a layer of a nickel-based intermetallic compound on a semiconductor layer made of Si, Ge, or SiGe of any other type of electronic component, for example, a semiconductor region of a FinFET transistor, provided for the semiconductor region to have an epitaxial-type crystal structure or epitaxial structure, that is, a structure with a regular crystal mesh or, in other words, a single-crystal structure. FIG. 2 schematically shows in cross-section view the transistor 1 of FIG. 1 at a step of an embodiment of a method of manufacturing a nickel-based intermetallic compound.

At the step of FIG. 2, a NiPt layer 20, that is, a layer made of a nickel (Ni) and platinum (Pt) alloy, has been deposited on semiconductor regions 14, and more particularly, herein, on semiconductor regions 14B. Layer 20 is, for example, deposited over the entire exposed surface of regions 14B. Preferably, layer 20 is deposited over the entire structure, that is, over the entire semiconductor wafer comprising transistor 1 and other electronic integrated circuit components formed from the semiconductor wafer. As an example, layer 20 is conformally deposited. The thickness of layer 20 is, for example, in the range from approximately 5 nm to 15 nm, for example, equal to approximately 10 nm.

The deposition of layer 20 is performed so that the Pt atom concentration in layer 20 is equal to 15% plus or minus 1%, preferably equal to 15%.

Preferably, before the deposition of layer 20, a surface preparation step or cleaning step is provided, for example, to remove oxide having formed on the exposed surface of regions 14B. As an example, such a step is carried out with a hydrofluoric acid solution (HF), for example, by dipping the semiconductor wafer into the solution.

Preferably, although this is not illustrated herein, a titanium nitride (TiN) layer is deposited over the entire upper surface of layer 20.

Figure 3:
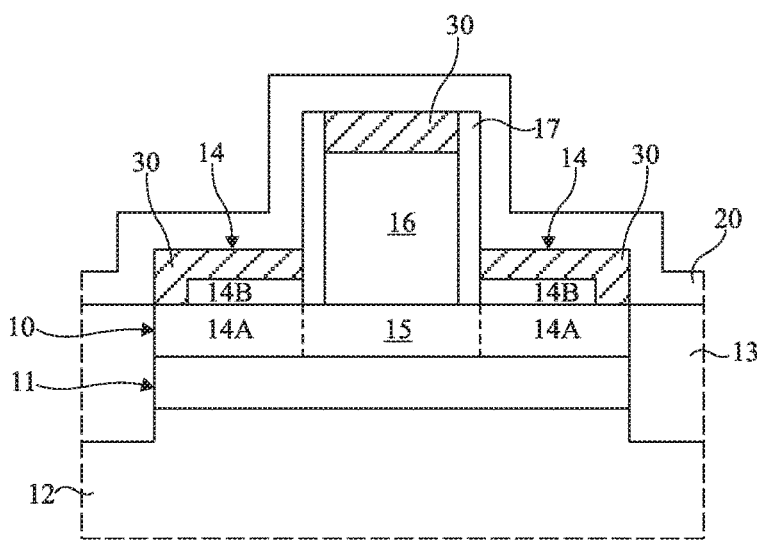
FIG. 3 schematically shows in cross-section view the component of FIG. 1 at another step of an implementation mode of a method of manufacturing a nickel-base intermetallic compound.

FIG. 3 schematically shows in cross-section view the component of FIG. 1 at another step of an embodiment of a method of manufacturing a nickel-based intermetallic compound. More particularly, FIG. 3 shows transistor 1 at a step following the step described in relation with FIG. 2.

At the step of FIG. 3, an anneal is performed so that a layer 30 of nickel-based intermetallic compound forms from the nickel of layer 20 and from the semiconductor material with which layer 20 is in contact, at the level of each contact surface, or interface, between layer 20 and the semiconductor material. As an example, the thickness of each layer 30 is in the range from approximately 5 nm to approximately 12 nm, for example, equal to approximately 8 nm. Each layer 30 comprises nickel and semiconductor material from which it has been formed.

In the example of transistor 1, a layer 30 forms on the upper surface of each semiconductor region 14B and on the sides of each region 14B, on the side opposite to gate 16. In other words, after this anneal, each semiconductor region 14B is covered with a layer 30. When the gate electrode comprises polysilicon, a layer 30 also forms at the top of gate 16, although the structure of the intermetallic compound of layer 30 at the top of gate 16 is different from that of the intermetallic compound of the layers 30 formed on regions 14B.

The anneal is implemented at a temperature of 260° plus or minus 20° C., for example, at a temperature of 260° C. plus or minus 10° C., preferably at a 260° C. temperature. Further, the anneal has a duration in the range from 20 to 60 seconds, for example, a duration of 30 seconds plus or minus 10 seconds, for example, plus or minus 5 seconds, preferably a duration of 30 seconds.

In the following description, the layers 30 covering semiconductor regions 14B are more particularly considered.

At the end of the anneal described in relation with FIG. 3, nickel-rich crystal phases are obtained at the level of layers 30. More particularly, according to whether regions 14B are made of silicon, of germanium, or of silicon-germanium, $Ni_2Si$, $Ni_2Ge$, or $Ni_2Si_xGe_{(1-x)}$-type phases are obtained.

It should be noted that platinum is present in layers 30, that is, layers 30 may comprise free platinum atoms (Pt), which are not bonded to the material of layers 30, for example, platinum which is not bonded to $NiSi_xGe_{(1-x)}$ in the case of layers 30 covering and obtained from $Si_xGe_{(1-x)}$ regions 14B. The maximum Pt atom concentration in the layers 30 covering semiconductor regions 14B is maximum at the upper surface of layer 30 and is, for example, equal to approximately 20%.

The Inventor has observed that the crystal structure or crystal mesh of the layers 30 covering regions 14B is identical to the crystal structure or crystal mesh of the regions 14B that they cover. In other words, there is no lattice mismatch between regions 14B and the layers 30 covering them. In still other words, the crystal structure of the material of the layers 30 covering regions 14B is aligned with the crystal structure of the semiconductor material of regions 14B. Still in other words, the material of the layers 30 formed from a semiconductor region 14B has a structure of heteroepitaxy with the semiconductor material from which it forms.

As a result, the intermetallic compound of the layers 30 covering regions 14B is particularly stable, particularly due to the fact that there is in the literal sense of the term no interface between the intermetallic material of layer 30 and the semiconductor material of regions 14B. Particularly, the intermetallic compound described herein is insensitive to the agglomeration phenomenon and will not form, in the temperature ranges applied to transistor 1, clusters in regions 14B. Further, the intermetallic compound does not diffuse into the semiconductor material of regions 14, nor into that of region 15.

As an example, the analysis of the crystal structure of the intermetallic compound of layers 30 may be performed by transmission electronic microscopy or TEM, implementing an automatic crystal orientation and phase mapping or ASTAR method. In this case, the mapping obtained for the intermetallic compound of the layers 30 covering regions 14B has an epitaxial structure, with no degree of liberty, rather than a random fiber or axiotaxial structure.

Figure 4:
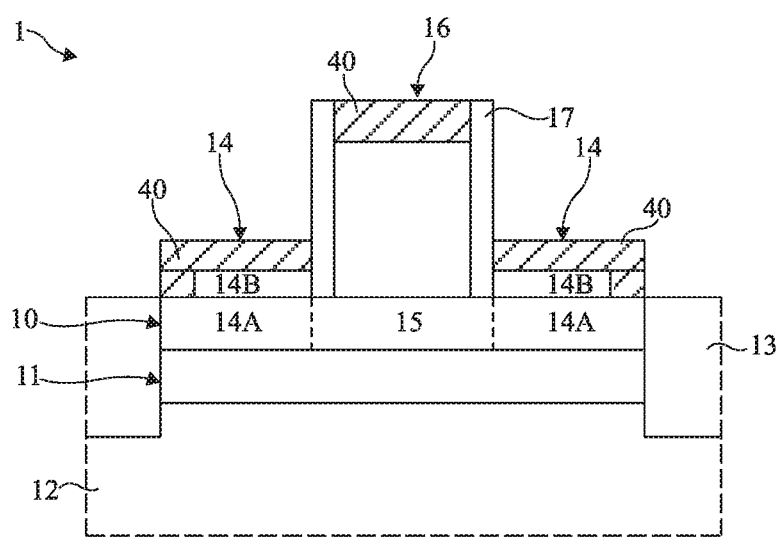
FIG. 4 schematically shows in cross-section view the component of FIG. 1 at another step of an implementation mode of a method of manufacturing a nickel-base intermetallic compound.

FIG. 4 schematically shows in cross-section view the transistor 1 of FIG. 1 at another step of an embodiment of a method of manufacturing a nickel-based intermetallic compound. More particularly, FIG. 4 shows transistor 1 at a step following the step described in relation with FIG. 3.

At this step, layer 20 has been removed by etching, to remove the material of layer 20 which has not reacted with semiconductor material during the previous step, that is, to remove the excess platinum and nickel.

When a titanium nitride layer has been deposited over the upper surface of layer 20 at the step described in relation with FIG. 2, the titanium nitride layer is also removed by etching, prior to the removal of layer 20.

At the step of FIG. 4, another anneal is preferably implemented, for example, an anneal at a temperature greater than 380° C., for example, for less than one minute. As an example, the second anneal is carried out at a 390° C. temperature for, for example 20 seconds, or at a 420° C. temperature for, for example, 30 seconds.

The Inventor has observed that the second anneal, at a temperature higher than the first anneal, results in the transformation of the layers 30 of FIG. 3 into layers 40, while the structure or crystal mesh of the intermetallic compound of the layers covering semiconductor regions 14B is not modified. This enables to keep the electrical and physical properties of the intermetallic compound which have been described in relation with FIG. 3, particularly as concerns the forming of NiSi clusters and the diffusion of the intermetallic compound in semiconductor regions 14 and 15.

In other words, if regions 14B are made of silicon, layers 40 comprise one nickel atom for one silicon atom, if regions 14B are made of germanium, layers 40 comprises one nickel atom for one germanium atom, and if regions 14B are made of silicon-germanium, layers 40 comprise one nickel atom for each silicon atom and one nickel atom for each germanium atom. More particularly, in this last case, calling x the silicon content in the silicon-germanium alloy of regions 14B, that is, regions 14B being made of $Si_xGe_{(1-x)}$, the layers 40 considered herein are made of NiSi$_x$Ge$_{(1-x)}$, where x is in a range from 0.2 to 0.5. For example, for silicon-germanium regions 14B with a 70% concentration of germanium atoms, the layers 40 covering regions 14B are made of NiSi$_{0.3}$Ge$_{0.7}$.

It should be noted that the advantageous structure of the intermetallic compound of the finally obtained layers 40 (layers 30 before the second anneal) covering semiconductor regions 14B is not obtained if the platinum concentration in layer 20 and/or the conditions (temperature and/or duration) of the first anneal described in relation with FIG. 3 are different from those previously indicated. In particular, if the platinum concentration in layer 20 and/or the conditions of the first anneal (FIG. 3) differ from those previously indicated, the crystal structure of the intermetallic compound may be at least partly destroyed during the second anneal described in relation with FIG. 4, resulting in the forming of a more poorly ordered fiber-type crystal structure within layer 40.

Although this is not illustrated, the method may further comprise, after the step described in relation with FIG. 4, all or part of the successive steps of: depositing, for example, by conformal deposition, an insulating layer, for example, made of SiO$_2$, to cover component 1, for example, an insulating layer having a thickness greater than the height of component 1, that is, the height of gate 16 in the present example; planarizing the exposed surface, that is, the upper surface, of the insulating layer, for example by CMP ("Chemical Mechanical Polishing"), the planar surface thus obtained being arranged above the upper level of component 1, that is, above the top of gate 16 in the present example; etching trenches through the planarized insulating layer, all the way to layers 40; and filling the trenches with a conductive material to form conductive vias in contact with layers 40, such vias being currently called contacts.

Various embodiments and variations have been described. It will be understood by those skilled in the art that certain features of these various embodiments and variations may be combined, and other variations will occur to those skilled in the art. In particular, it will be within the abilities of those skilled in the art to implement the above-described method in the case where the nickel-based intermetallic compound is formed on and from any semiconductor Si, Ge, or SiGe region having an epitaxial crystal structure. It should be noted that a semiconductor region having an epitaxial crystal structure does not necessarily mean that the region has been formed by epitaxy, and a semiconductor region with an epitaxial crystal structure may for example be a portion of a solid semiconductor substrate or of a semiconductor layer of an SOI-type structure.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
   a) depositing a Nickle-Platinum (NiPt) layer on a semiconductor region, wherein a Platinum atom concentration consists exclusively in a range of 14% to 16%; and
   b) performing a first anneal at a temperature of 260° C. plus or minus 20° C. for a duration in the range from 20 to 60 seconds to produce, from the Nickle-Platinum (NiPt) layer and the semiconductor material of said semiconductor region, an intermetallic layer;
   wherein the intermetallic layer possesses a structure of heteroepitaxy with the semiconductor material.

2. The method of claim 1, further comprising: c) removing by etching portions of the NiPt layer which remain after performing the first anneal.

3. The method of claim 2, further comprising: d) performing a second anneal after said portions of the NiPt layer have been removed.

4. The method of claim 3, wherein performing the second anneal is carried out at a temperature greater than 380° C.

5. The method of claim 1, wherein the semiconductor region has an epitaxial crystal structure.

6. The method of claim 1, wherein the semiconductor region is made of a material selected from the group consisting of: Si, Ge, or SiGe.

7. The method of claim 1, wherein the semiconductor region is made of a SiGe material which is specifically SixGe(1-x) wherein x is in a range from 0.2 to 0.5.

8. The method of claim 1, further comprising epitaxially forming the semiconductor region.

9. The method of claim 8, wherein epitaxially forming is carried out from a semiconductor layer made of a material selected from the group consisting of: Si, Ge, or SiGe.

10. The method of claim 9, wherein the semiconductor layer is a solid substrate layer.

11. The method of claim 9, wherein the semiconductor layer rests on an insulating layer forming a semiconductor on insulator substrate.

12. The method of claim 1, wherein the intermetallic layer includes free Platinum atoms not bonded to metal atoms and semiconductor atoms of the intermetallic layer.

13. The method of claim 1, wherein a concentration of Platinum atoms in the intermetallic layer is highest at an upper surface of the intermetallic layer.

14. The method of claim 1, wherein the semiconductor region is a source or drain region of a MOS transistor.

* * * * *